United States Patent
Purcarea et al.

(10) Patent No.: US 11,942,927 B2
(45) Date of Patent: Mar. 26, 2024

(54) METHOD AND DEVICE FOR SHORT-CIRCUIT DETECTION BY SATURATION DETECTION IN POWER SEMICONDUCTOR SWITCHES

(71) Applicant: Robert Bosch GmbH, Stuttgart (DE)

(72) Inventors: Calin Purcarea, Muehlacker (DE); Daniel Schweiker, Ludwigsburg (DE); Deepa Mathai, Stuttgart (DE); Falko Friese, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 242 days.

(21) Appl. No.: 17/638,261

(22) PCT Filed: Aug. 13, 2020

(86) PCT No.: PCT/EP2020/072789
§ 371 (c)(1),
(2) Date: Feb. 25, 2022

(87) PCT Pub. No.: WO2021/037580
PCT Pub. Date: Mar. 4, 2021

(65) Prior Publication Data
US 2022/0294441 A1 Sep. 15, 2022

(30) Foreign Application Priority Data
Aug. 28, 2019 (DE) ............ 10 2019 212 889.0

(51) Int. Cl.
*H03K 17/082* (2006.01)
*H03K 17/0812* (2006.01)
*H03K 17/18* (2006.01)

(52) U.S. Cl.
CPC ... *H03K 17/0828* (2013.01); *H03K 17/08128* (2013.01); *H03K 17/0822* (2013.01); *H03K 17/18* (2013.01)

(58) Field of Classification Search
CPC ............ H03K 17/082; H03K 17/0822; H03K 17/0828; H02H 3/08; H02H 3/087
See application file for complete search history.

(56) References Cited

U.S. PATENT DOCUMENTS

2006/0187604 A1*  8/2006  Ohshima ................ H02H 3/093
                                                    361/100
2019/0267795 A1*  8/2019  Oda ......................... H02H 7/12

FOREIGN PATENT DOCUMENTS

DE    102015120166 B3   11/2016
DE    102016212211 A1    1/2018
WO         9201335 A1    1/1992

OTHER PUBLICATIONS

Translation of International Search Report for Application No. PCT/EP2020/072789 dated Dec. 17, 2020 (3 pages).

* cited by examiner

*Primary Examiner* — Jared Fureman
*Assistant Examiner* — Christopher J Clark
(74) *Attorney, Agent, or Firm* — Michael Best & Friedrich LLP

(57) ABSTRACT

The present invention relates to a method for short-circuit detection by saturation detection in power semiconductor switches and to a corresponding device. A reference voltage ($U_{ref}$) is provided as a function of a supply voltage (UVDD) of a power semiconductor switch. A differential voltage ($U_{diff}$) is generated from the difference of a voltage drop ($U_A$) of a load path of the power semiconductor switch and the provided reference voltage ($U_{ref}$). The generated differential voltage ($U_{diff}$) is compared with a predetermined threshold voltage ($U_{lim}$). A short-circuit current in the load path of the power semiconductor switch is detected when the differential voltage ($U_{diff}$) exceeds the threshold voltage ($U_{lim}$). In this case, the power semiconductor switch is opened.

9 Claims, 3 Drawing Sheets

METHOD AND DEVICE FOR SHORT-CIRCUIT DETECTION BY SATURATION DETECTION IN POWER SEMICONDUCTOR SWITCHES

BACKGROUND OF THE INVENTION

Power electronics circuits generally have power semiconductors which are operated as switches (power semiconductor switches). These power semiconductor switches are usually metal-oxide semiconductor field-effect transistors (MOSFETs) or insulated-gate bipolar transistors (IGBTs). For the vast majority of applications, these MOSFETs and IGBTs are based on silicon (Si).

In many applications, in particular at relatively high powers and in the case of series circuits of power semiconductor switches (for example in the form of half-bridges), the power semiconductor switches need to be protected from short-circuit currents, in particular from half-bridge short circuits. For this purpose, the load current of the power semiconductor switch is measured directly or indirectly and, in the event that the permissible operating range is exceeded, the power semiconductor switch is opened independently of its regular drive signal, with the result that the short-circuit current is interrupted. The short-circuit detection needs to take place comparatively quickly since power semiconductor switches only have a limited short-circuit strength owing to their low thermal mass. The short-circuit strength is generally referred to as the permissible short-circuit duration. For industrial applications, this is approximately 10 μs [microseconds], and for vehicle traction inverters, approximately 3 μs. The switch-off operation of a short-circuit current lasts approximately 1-2 μs. It follows from this that the short-circuit detection in the case of vehicle traction inverters needs to take place within approximately 1-2 μs.

Substantially, two short-circuit detection methods are known:
  I-Sense
  Desat (desaturation detection, in the case of IGBTs) or Sat (saturation detection, in the case of MOSFETs).

In order to circumvent complex measurement of the load current of the power semiconductor switch, the (De)Sat detection is directed towards the indirect measurement of the voltage drop across the load path of the power semiconductor switch (IGBT: collector-emitter voltage; MOSFET: drain-source voltage).

In the switched-on state, during closed-loop control, the voltage drop across the power semiconductor switch should be as low as possible in order to minimize the conduction losses. Conventional voltage drops, for example in the case of 500 V applications, are approximately 1-3 V [volts]. Short-circuit currents are usually a multiple of the regular operating current and therefore result in markedly higher voltage drops across the power semiconductor switch. In the event of a short circuit, the power semiconductor switch often itself limits the short-circuit current since the regular operating range is left in the conducting state (for example MOSFET: ohmic range). In this case, an IGBT desaturates and a MOSFET saturates, hence also the names given to these short-circuit detection methods: Desat from "desaturation detection" (IGBT) and Sat from "saturation detection" (MOSFET).

Since the voltage drop across a power semiconductor switch in the off state is markedly higher than in the conducting state (for example 500 V to 1.5 V), and the short-circuit detection is intended to take place quickly despite switching operations with steep edges, the voltage drop is not measured directly across a high-resistance voltage divider (plus filter and instrument amplifier). Instead, an indirect measurement is used with the aid of decoupling diodes.

In order to measure the voltage drop across the power semiconductor switch in the conducting state, a (low) (auxiliary) current is fed into the power path of the power semiconductor via the decoupling diode. This (auxiliary) current is fed by means of a pull-up resistor or a current source circuit from the positive (gate-driver) supply voltage, i.e. the supply voltage of the power semiconductor switch. The voltage drop across the anode of the decoupling diode now corresponds to the voltage drop across the power semiconductor switch plus the forward voltage of the decoupling diode. The measurement signal can additionally be filtered and evaluated by means of a comparator circuit.

If the voltage drop across the power semiconductor switch exceeds a predefined limit value, a short-circuit current is detected and a corresponding switch-off operation is initiated.

In the off state, there is a voltage drop across the power semiconductor switch which is greater than the (gate-driver) supply voltage. Therefore, the decoupling diode turns off. Short-circuit monitoring in the off state is therefore not possible (but also not required). In order to prevent charging of the input filter by means of the pull-up resistor, in the switched-off state a clamping transistor to ground is activated.

The described form of the short-circuit detection represents the most common short-circuit detection method and is already integrated in many gate-driver ICs available on the market, with the result that only one decoupling diode and one analog (RC) filter are required as external circuitry.

DE 2016 212 211 A1 describes short-circuit detection. Said document discloses a device for switching off a bipolar transistor having a collector, emitter and gate terminal. The device comprises a voltage measurement unit for measuring a gate-emitter voltage drop between the gate terminal and the emitter terminal, a comparison unit, which is connected to the voltage measurement unit, for comparing the gate-emitter voltage with a preset threshold value, wherein the comparison unit provides a tripping signal on the output side when the gate-emitter voltage is greater than the threshold value, a switching status detection unit (19) for detecting a load current flowing from the collector terminal to the emitter terminal, wherein the switching status detection unit, on detection of a load current, provides a load current signal on the output side, and a control unit, which is connected to the switching status detection unit and the comparison unit and which generates a switch-off signal for switching off the bipolar transistor in the event that a load current signal and a tripping signal are obtained simultaneously.

SUMMARY OF THE INVENTION

The present invention provides a method for short-circuit detection by saturation detection in power semiconductor switches and a corresponding device. Configurations and developments of the present invention are the subject matter of the dependent claims.

The tripping threshold of the comparator circuit is generally fixedly preconfigured in the case of integrated (De)Sat detections which are integrated in gate-driver ICs or can be configured from a primary side. Since the indirect measurement of the voltage drop across the power semiconductor is based on a current flow from the (gate-driver) supply voltage via the decoupling diode(s) and the power semiconductor, no voltage drops across the power semiconductor which are greater than the (gate-driver) supply voltage can be measured.

The (gate-driver) supply voltage varies on the basis of tolerances and faults. Conventional values may be:
typical supply: 18 V
typical tolerance: ±1 V
voltages in the event of a fault: 10 V . . . 20 V.

Since the short-circuit detection is a safety-relevant function, it needs to function throughout the supply voltage range (i.e. even in the event of a fault of a supply voltage). The tripping threshold of the short-circuit detection needs to be selected such that normal operating currents are not detected as a short circuit and switched off, hence the minimum permissible tripping threshold (voltage drop across power semiconductors). It depends on the application and type as well as design of the power semiconductor. Typical values for the minimum tripping threshold in the case of IGBT applications can be approximately 3 V and in the case of the use of wide-bandgap power semiconductors 10 V . . . 15 V. Short-circuit detection below the minimum tripping threshold only needs to be guaranteed in a restricted range of the supply voltages, for example in the nominal supply voltage range (supply is fault-free).

For this purpose, the present invention corrects the tripping threshold depending on the supply voltage. In particular also in the case of a large supply voltage range, a high minimum tripping threshold and/or wide-bandgap power semiconductors (SiC, GaN etc.), short-circuit detection is possible with the present invention.

In accordance with a first aspect of the present invention, a method for short-circuit detection by saturation detection in power semiconductor switches comprises the steps of providing a reference voltage $U_{ref}$, generating a differential voltage $U_{diff}$, comparing the generated differential voltage $U_{diff}$ with a predetermined limit voltage Uiim and opening the power semiconductor switch. In the step of providing the reference voltage $U_{ref}$, the reference voltage $U_{ref}$ is provided depending on a supply voltage $U_{VDD}$ of a power semiconductor switch, with the result that the reference voltage $U_{ref}$ follows changes in the supply voltage $U_{VDD}$. In the step of generating a differential voltage $U_{diff}$, the differential voltage $U_{diff}$ corresponds to a difference between a voltage drop $U_A$ across a load path of the power semiconductor switch and the provided reference voltage $U_{ref}$. In the step of comparing the generated differential voltage $U_{diff}$ with the predetermined limit voltage $U_{lim}$, a short-circuit current is detected in the load path of the power semiconductor switch when the differential voltage $U_{diff}$ exceeds the limit voltage $U_{lim}$. In the step of opening the power semiconductor switch, the power semiconductor switch is opened when a short-circuit current has been detected in the load path of the power semiconductor switch.

In accordance with a second aspect of the present invention, a device for short-circuit detection by saturation detection in power semiconductor switches comprises at least one decoupling diode, a current source, a reference voltage source, a comparator circuit and evaluation electronics. The at least one decoupling diode is designed to be electrically connected to a drain terminal or a collector terminal of a power semiconductor switch. A voltage drop $U_A$ across an anode of the at least one decoupling diode corresponds to a voltage drop $U_A$ across a load path of the power semiconductor switch. The current source is electrically connected to the at least one decoupling diode. The current source is designed to feed an auxiliary current into a load path of the power semiconductor switch when the at least one decoupling diode is electrically connected to the drain terminal or the collector terminal of the power semiconductor switch. The reference voltage source is designed to be electrically connected to a supply current source for the power semiconductor switch. The reference voltage source is further designed to provide a reference voltage $U_{ref}$ depending on a supply voltage $U_{VDD}$ of the supply current source, with the result that the reference voltage $U_{ref}$ follows changes in the supply voltage $U_{VDD}$. The comparator circuit is electrically connected to the at least one decoupling diode and the reference voltage source. The comparator circuit is designed to generate a differential voltage $U_{diff}$, which corresponds to a difference between the voltage drop $U_A$ across the load path of the power semiconductor switch and the provided reference voltage $U_{ref}$. The evaluation electronics are designed to compare the generated differential voltage $U_{diff}$ with a predetermined limit voltage $U_{lim}$. A short-circuit current in the load path of the power semiconductor switch is detected when the differential voltage $U_{diff}$ exceeds the limit voltage $U_{lim}$. The evaluation electronics are further designed to open the power semiconductor switch when a short-circuit current has been detected in the load path of the power semiconductor switch.

The reference voltage $U_{ref}$ is coupled to the supply voltage $U_{VDD}$ of the power semiconductor switch in such a way that, in the event of a rise or fall in the supply voltage $U_{VDD}$, the reference voltage $U_{ref}$ likewise correspondingly rises or falls. This coupling of the reference voltage $U_{ref}$ to the supply voltage $U_{VDD}$ can take place via an analog circuit, with the result that the changes in the reference voltage $U_{ref}$ corresponding to the supply voltage $U_{VDD}$ take place highly dynamically (substantially without any time difference). The reference voltage $U_{ref}$ therefore tracks the supply voltage $U_{VDD}$. The supply current source can provide, for example, current with a supply voltage $U_{VDD}$ of 18 V.

The differential voltage Urhff between the voltage drop $U_A$ across the load path of the power semiconductor and the reference voltage $U_{ref}$ is generated ($U_{diff}=U_{66}-U_{ref}$) and compared with the predetermined limit voltage $U_{lim}$. The predetermined limit voltage $U_{lim}$ is selected in such a way that it corresponds to the at least occurring voltage in the event of a short circuit, for example $U_{lim}=10$ V . . . 20 V. Thus, when the voltage drop $U_A$ across the load path of the power semiconductor exceeds the normal operating range (for example 17 V . . . 19 V) owing to a short circuit (for example $U_A$ =40 V), the differential voltage $U_{diff}$ will likewise rise (for example $U_{diff}=U_A-U_{ref}=40$ V–18 V=12 V). Thus, the differential voltage $U_{diff}$ exceeds the predetermined limit voltage (for example $U_{diff}=10$ V), and a short circuit of the power semiconductor switch is detected. By virtue of the tracking of the reference voltage $U_{ref}$, it is also possible in the case of the very high voltage drop $U_A$ for the tripping threshold of a (De)Sat detection to be clearly detected or measured.

If the comparison of the differential voltage $U_{diff}$ and the predetermined limit voltage $U_{lim}$ shows that the differential voltage $U_{diff}$ is equal to or greater than the predetermined limit voltage $U_{lim}$, a short circuit is detected and the power semiconductor switch is opened. The comparison of the differential voltage $U_{diff}$ and the predetermined limit voltage $U_{lim}$ and the opening of the power semiconductor switch when a short circuit is detected by means of the comparison can take place by means of the (De)Sat detection, which is implemented in an integrated circuit (IC). The described functionality can alternatively also take place completely in a discrete (analog) circuit.

Since the tripping threshold of the (De)Sat detection, owing to the tracked reference voltage $U_{ref}$ in accordance with the present invention, is dependent on the supply voltage $U_{VDD}$, an additional degree of freedom in the circuit design is achieved. This degree of freedom means that a high minimum tripping threshold (in a restricted supply voltage range) is achieved and, at the same time, short-circuit detection can be guaranteed over the entire supply voltage range.

In accordance with one development of the present invention, the reference voltage $U_{ref}$ is provided between a Zener diode, which is electrically connected to the supply current source for the power semiconductor switch, and a parallel circuit comprising a first resistor and a first capacitor, which is electrically connected to ground GND.

In accordance with a further development of the present invention, the reference voltage source comprises a Zener diode and a parallel circuit comprising a first resistor and a first capacitor. The reference voltage $U_{ref}$ is provided between the Zener diode, which is electrically connected to the supply current source for the power semiconductor switch, and the parallel circuit, which is electrically connected to ground GND.

This configuration of the reference voltage source provides sufficiently accurate provision of the reference voltage $U_{ref}$ (in comparison with a simple voltage divider, for example) and is nevertheless inexpensive (in comparison with, for example, a precision reference).

In accordance with one development of the present invention, the voltage drop $U_A$ across the load path of the power semiconductor switch is tapped off at an anode of at least one decoupling diode. The at least one decoupling diode is electrically connected to a drain terminal or a collector terminal of the power semiconductor switch. The at least one decoupling diode is fed the auxiliary current from a current source by means of a pull-up resistor.

The pull-up resistor enables a robust provision of the auxiliary current and is nevertheless inexpensive.

In accordance with one development of the present invention, the device further comprises an input filter, which is connected electrically in parallel with the power semiconductor switch.

The input filter increases the robustness of the circuit or application.

In accordance with one development of the present invention, the method further comprises the step of preventing charging of an input filter. In the step of preventing the charging of the input filter, the charging of the input filter, which is connected electrically in parallel with the power semiconductor switch, by means of the pull-up resistor is prevented in a switched-off state by means of a clamping transistor, which is connected electrically in parallel with the input filter.

In accordance with a further development of the present invention, the device further comprises a clamping transistor. The clamping transistor is connected electrically in parallel with the input filter. The clamping transistor is designed to prevent charging of the input filter by means of the pull-up resistor in a switched-off state.

The clamping transistor is connected to ground (GND) in the switched-off state for this purpose.

BRIEF DESCRIPTION OF THE DRAWINGS

The invention and the technical background will be explained in more detail below with reference to the figures. It will be mentioned that the invention is not intended to be restricted by the exemplary embodiments shown. In particular, insofar as it is not explicitly illustrated otherwise, it is also possible to extract sub-aspects of the substantive matter explained in the figures and to combine them with other parts and knowledge from the present description and/or figures. In particular, it will be mentioned that the figures and in particular the illustrated size relationships are merely schematic. The same reference symbols denote identical subjects, with the result that, if appropriate, explanations can be used from other figures in supplementary fashion.

DETAILED DESCRIPTION

Figure 1:
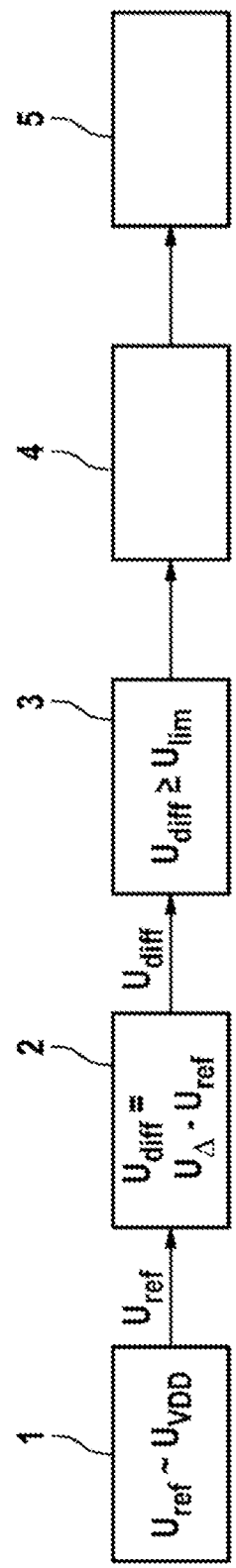
FIG. 1 shows a schematic flowchart of the method for short-circuit detection by saturation detection in power semiconductor switches.

FIG. 1 shows, schematically, the method for short-circuit detection by saturation detection in power semiconductor switches. The method comprises the step of providing 1 a reference voltage $U_{ref}$, generating 2 a differential voltage $U_{diff}$, comparing 3 the generated differential voltage $U_{diff}$ with a predetermined limit voltage $U_{lim}$, opening 4 the power semiconductor switch and optionally preventing 5 charging of an input filter. The steps of the method can take place in any desired sequence and/or at least partially at the same time.

In the step of providing 1 the reference voltage $U_{ref}$, the reference voltage is provided depending on the supply voltage $U_{VDD}$ of the power semiconductor switch. The reference voltage $U_{ref}$ in this case follows changes in the supply voltage $U_{VDD}$. For this purpose, the reference voltage $U_{ref}$ is provided or tapped off between a Zener diode and a parallel circuit comprising a first resistor and a first capacitor. The Zener diode is electrically connected to the supply current source for the power semiconductor switch. The parallel circuit comprising the first resistor and the first capacitor is electrically connected to ground GND. The supply current source provides current with a supply voltage $U_{VDD}$ of 18 V.

$$U_{ref} \sim U_{VDD}$$

In the step of generating 2 the differential voltage $U_{diff}$, the differential voltage $U_{diff}$ corresponds to a difference between a voltage drop $U_A$ across a load path of the power semiconductor switch and the provided reference voltage $U_{ref}$.

$$U_{diff} = U_{66} - U_{ref}$$

The voltage drop $U_A$ across the load path of the power semiconductor switch is tapped off at an anode of at least one decoupling diode, which is electrically connected to a drain terminal or a collector terminal of the power semiconductor switch. The at least one decoupling diode is in this case fed the auxiliary current from a current source by means of a pull-up resistor.

In the step of comparing 3 the generated differential voltage $U_{diff}$ with the predetermined limit voltage $U_{lim}$, the differential voltage $U_{diff}$ is compared with the predetermined limit voltage $U_{lim}$. The limit voltage $U_{lim}$ is in this case 10 V to 20 V. In this case, a short-circuit current is detected in the load path of the power semiconductor switch when the differential voltage $U_{diff}$ reaches or exceeds the limit voltage $U_{lim}$.

$U_{diff} \geq U_{lim}$

In the step of opening 4 the power semiconductor switch, the power semiconductor switch is opened when a short-circuit current has been detected in the load path of the power semiconductor switch.

In addition, in the optional step of preventing 5 charging of the input filter, charging of the input filter by means of the pull-up resistor is prevented in the switched-off state. The input filter is connected electrically in parallel with the power semiconductor switch. By means of the pull-up resistor, the input filter could be charged in a switched-off state. This is prevented by a clamping transistor, which is connected electrically in parallel with the input filter.

Figure 2:
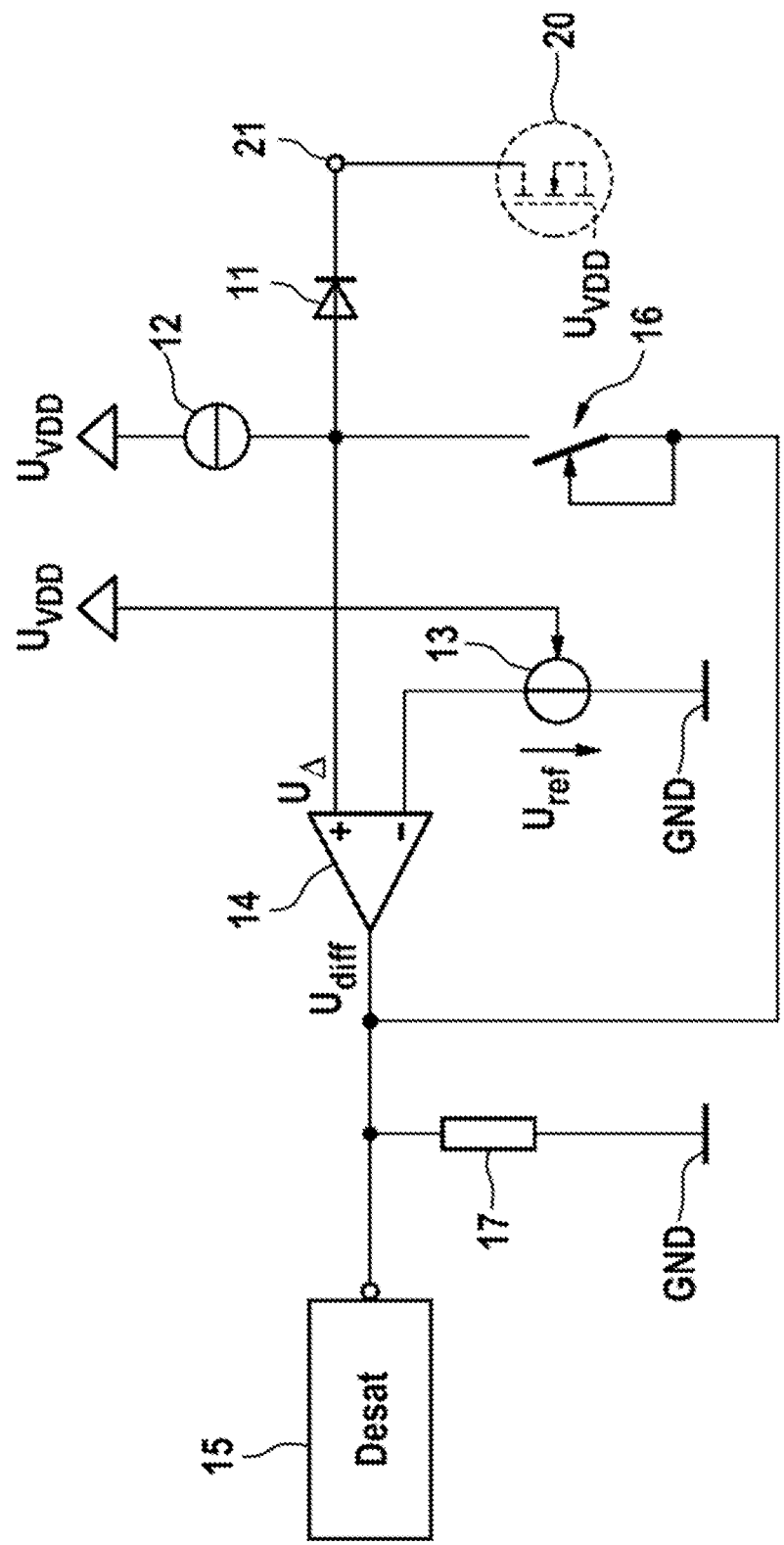
FIG. 2 shows a schematic basic circuit diagram of the device for short-circuit detection by saturation detection in power semiconductor switches.

FIG. 2 shows, schematically, the device 10 for short-circuit detection (short-circuit detection circuit) by saturation detection in power semiconductor switches. The device 10 can implement the method from FIG. 1.

The device 10 comprises the following components:
- a decoupling diode 11 to a drain terminal 21 (or alternatively to a collector terminal (not illustrated)) of the power semiconductor 20;
- a current source 12 (in the form of a pull-up resistor, not illustrated);
- a reference voltage source 13 with dependence on a supply voltage $U_{VDD}$ of the power semiconductor 20;
- a comparator circuit 14;
- evaluation electronics 15;
- a clamping transistor 16; and
- output circuitry 17.

The decoupling diode 11 is electrically connected (with its anode) to the current source 12 and is also electrically connected, in the direction of flow, (with its cathode) to the drain terminal 21 of the power semiconductor switch 20. The voltage drop $U_A$ across the load path of the power semiconductor switch 20 is tapped off at the anode of the decoupling diode 11. The current source 12 in this case provides the auxiliary current from the supply voltage $U_{VDD}$ for the decoupling diode 11 in order that the voltage drop $U_A$ can be measured or tapped off at the anode of the decoupling diode 11.

The reference voltage source 13 provides the reference voltage $U_{ref}$. The reference voltage $U_{ref}$ follows a supply voltage $U_{VDD}$ of the supply current source of the power semiconductor switch 20.

The decoupling diode 11 (with its anode) and the reference voltage source 13 are electrically connected to the comparator circuit 14 in such a way that the output of the comparator circuit 14 has the differential voltage $U_{diff}$, wherein the differential voltage $U_{diff}$ corresponds to the difference between the voltage drop $U_A$ across the load path of the power semiconductor switch 20 and the reference voltage $U_{ref}$.

The comparator circuit 14 is electrically connected with its output to the evaluation electronics 15. The evaluation electronics 15 are in this case an integrated circuit (IC), which can implement the Desat method. In this case, the power semiconductor switch 20 is opened by the evaluation electronics/IC 15 when the differential voltage $U_{diff}$ is equal to or greater than a predetermined limit voltage $U_{lim}$. In this case, the predetermined limit voltage $U_{lim}$ is selected in such a way that there is a short circuit in the power semiconductor switch 20 when the differential voltage $U_{diff}$ reaches or exceeds the predetermined limit voltage $U_{lim}$.

The clamping transistor 16 is electrically connected to the output of the comparator circuit 14 and the current source 12. In this case, the clamping transistor 16 prevents charging of an input filter of the device 10 by means of a pull-up resistor of the current source 12 in a switched-off state.

In addition, output circuitry 17 is electrically connected to the output of the comparator circuit 14. The output circuitry is connected to ground (GND).

The functionality illustrated in the basic circuit diagram of the device 10 can also be implemented in a (single) integrated circuit (IC) or completely in a discrete (analog) circuit.

Figure 3:
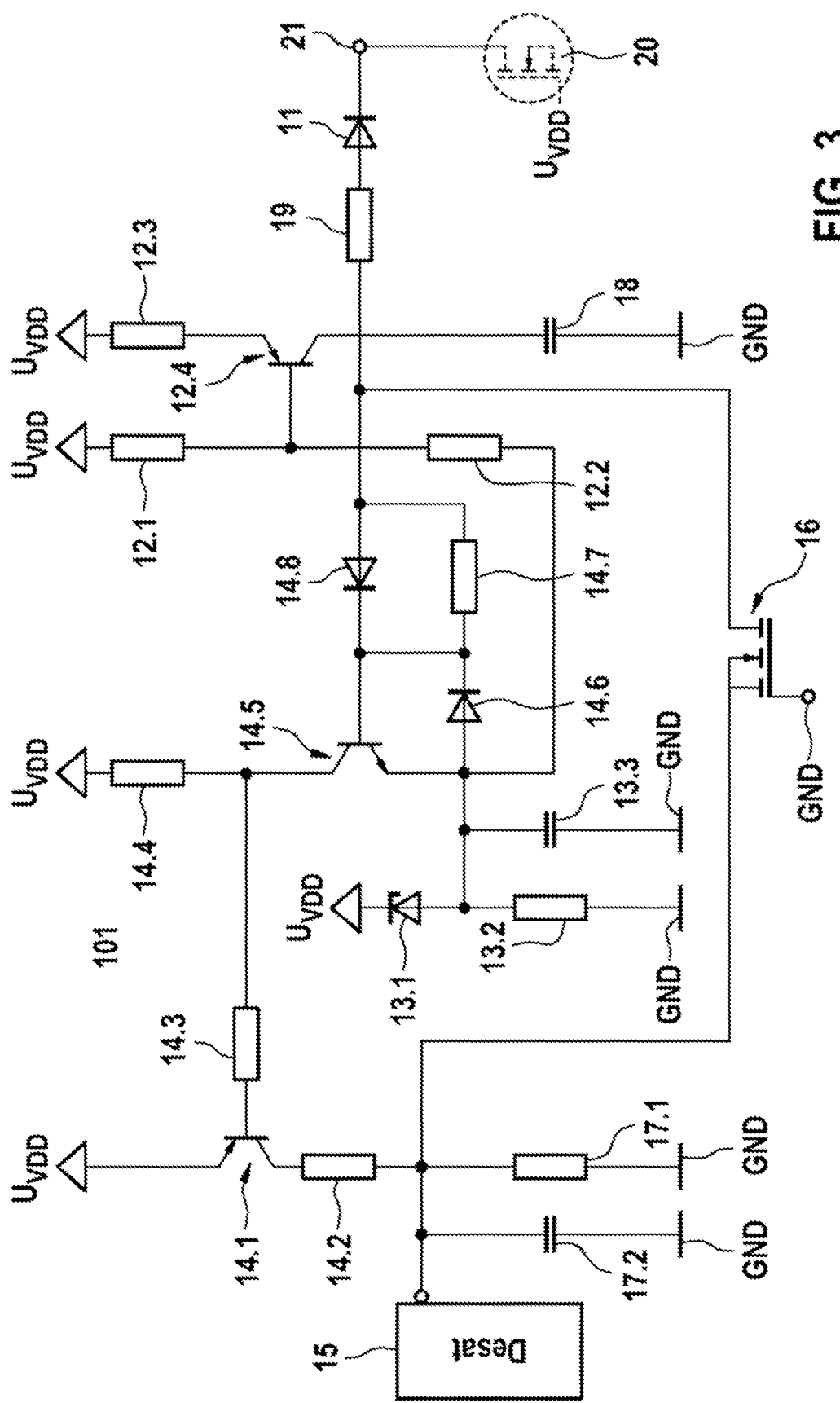
FIG. 3 shows a schematic equivalent circuit diagram of a special embodiment of the device from FIG. 2.

FIG. 3 schematically illustrates a special embodiment of the device 10 from FIG. 2. Only differences or special configurations of the device 10 in FIG. 3 in relation to the device from FIG. 2 will be explained.

The decoupling diode 11 is electrically connected with its anode via a pull-up resistor 19 to the current source 12 (more precisely to a collector terminal of a first PNP transistor 12.4 of the current source 12).

The current source 12 comprises a second resistor 12.1 and a fourth resistor 12.3, which are electrically connected to the supply current source of the power semiconductor 20 which provides the supply voltage $U_{VDD}$. In addition, the current source comprises a third resistor 12.2, which is connected electrically in series with the first resistor 12.1. In addition, the current source 12 comprises the first PNP transistor 12.4, wherein a bulk terminal of the first PNP transistor 12.4 is electrically connected between the first resistor 12.1 and the second resistor 12.2, an emitter terminal of the first PNP transistor 12.4 is electrically connected to the third resistor 12.3, and the collector terminal of the first PNP transistor 12.4 is electrically connected, via the pull-up resistor 19, to the anode of the decoupling diode 11. The collector terminal of the first PNP transistor 12.4 is additionally electrically connected to a third capacitor 18, wherein the third capacitor 18 is additionally connected to ground (GND).

The reference voltage source 13 comprises a Zener diode 13.1 and a parallel circuit comprising a first resistor 13.2 and a first capacitor 13.3. The Zener diode is electrically connected (with its cathode) to the supply current source of the power semiconductor switch 20. In addition, the Zener diode is electrically connected (with its anode) to the parallel circuit. The first resistor 13.2 and the first capacitor 13.3 of the parallel circuit are additionally connected to ground (GND). The Zener diode 13.1 is electrically connected with its anode additionally to the comparator circuit 14 (more precisely to an emitter terminal of an NPN transistor 14.5 and to an anode of a first diode 14.6 of the comparator circuit 14).

The comparator circuit 14 comprises a second PNP transistor 14.1, which is electrically connected with its emitter terminal to the supply current source of the power semiconductor switch 20, with its collector terminal to a fifth resistor 14.2 of the comparator circuit 14 and with its bulk terminal to a sixth resistor 14.3 of the comparator circuit 14. In addition, the comparator circuit 14 comprises the first NPN transistor 14.5, which is electrically connected with its collector terminal, via the sixth resistor 14.3, to the bulk terminal of the second PNP transistor. In addition, the collector terminal of the first NPN transistor 14.5 is electrically connected, via a seventh resistor 14.4 of the comparator circuit 14, to the supply current source of the power semiconductor switch 20. The emitter terminal of the first NPN transistor 14.5 is electrically connected to the anode of the Zener diode 13.1 of the reference voltage source 13, the anode of the first diode 14.6 of the comparator circuit 14 and the third resistor 12.2 of the current source 12. A bulk terminal of the first NPN transistor 14.5 and a cathode of the first diode 14.6 are electrically connected to a cathode of a second diode 14.8 of the comparator circuit 14 and, via an eighth resistor 14.7 of the comparator circuit, to the collector terminal of the first PNP transistor 12.4 of the current source or additionally, via the pull-up resistor 19, to the anode of the decoupling diode 11. The collector terminal of the second PNP transistor is electrically connected, via the fifth resistor 14.2, to the evaluation electronics 15.

The clamping transistor 16 is an n-channel insulated-gate field-effect transistor which is connected with its gate terminal to ground (GND), and which is electrically connected, on one side, with its source terminal and its gate terminal to the collector terminal of the second PNP transistor 14.1 of the comparator circuit 14 and the evaluation electronics 15 and, on the other side, with its drain terminal to the collector terminal of the first PNP transistor 12.4 of the current source 12 and, via the pull-up resistor 19, to the anode of the decoupling diode 11.

The output circuitry 17 in this case comprises a parallel circuit comprising a ninth resistor 17.1 and a second capacitor 17.2. The ninth resistor 17.1 and the capacitor are electrically connected on one side to ground (GND) and on the other side to the collector terminal of the second PNP transistor 14.1 via the fifth resistor 14.2, the evaluation electronics 15 and the source terminal and gate terminal of the n-channel insulated-gate field-effect transistor 16.

Although specific embodiments have been illustrated and described here, it is clear to a person skilled in the art that there is a multiplicity of alternatives and/or equivalent implementations. It should be appreciated that the exemplary configurations or embodiments are merely examples and are not intended to restrict the scope, the applicability or the configuration in any way. Rather, the above summary and detailed description will provide a person skilled in the art with sufficient instructions for implementing at least one preferred embodiment, wherein it goes without saying that various changes to the function and arrangement of the elements which are described in an exemplary configuration do not result from the application field set forth in the attached claims and their legal equivalents. In general, this application is intended to cover all adaptations and variations of the specific embodiments discussed here.

In the detailed description above, various features have been summarized in one or more examples in order to keep the disclosure concise. It goes without saying that the above description is intended to be illustrative and not restrictive. It is intended to cover all alternatives, amendments and equivalents which can be contained within the scope of the invention. Many other examples will become obvious to a person skilled in the art when studying the above disclosure.

In order to enable comprehensive understanding of the invention, a specific nomenclature is used which has been used in the above disclosure. However, it will become apparent to a person skilled in the art in the light of the specification contained therein that the specific details are not required in order to apply the invention. Thus, the above descriptions of specific embodiments of the present invention are illustrated for illustrative and descriptive purposes. They are not intended to be exhaustive or to restrict the invention to the above-disclosed precise embodiments; many modifications and variations in respect of the above-mentioned teachings are obviously possible.

The embodiments have been selected and described in order to best clarify the principles of the invention and their practical applications and in order to therefore give others skilled in the art the possibility of best applying the invention and various embodiments with various modifications as appears suitable for the respective application. Throughout the specification, the terms "including" and "in the case of which" are used as equivalents of the respective terms "comprising" and "in which". Furthermore, the terms "first", "second", "third" etc. are merely used as a designation and are not intended to place numerical demands on the objects or prescribe a specific sequence. In connection with the above description and the claims, the conjunction "or" should be understood to be inclusive ("and/or") and not exclusive ("either . . . or").

The invention claimed is:

1. A method for short-circuit detection by saturation detection in power semiconductor switches, comprising the following steps:
   providing (1) a reference voltage ($U_{ref}$) depending on a supply voltage ($U_{VDD}$) of a power semiconductor switch (20), with the result that the reference voltage ($U_{ref}$) follows changes in the supply voltage ($U_{VDD}$);
   generating (2) a differential voltage ($U_{diff}$) which corresponds to a difference between a voltage drop ($U_A$) across a load path of the power semiconductor switch (20) and the provided reference voltage ($U_{ref}$);
   comparing (3) the generated differential voltage ($U_{diff}$) with a predetermined limit voltage ($U_{lim}$), wherein a short-circuit current is detected in the load path of the power semiconductor switch (20) when the differential voltage ($U_{diff}$) exceeds the limit voltage ($U_{lim}$); and
   opening (4) the power semiconductor switch (20) when a short-circuit current has been detected in the load path of the power semiconductor switch (20).

2. The method as claimed in claim 1, wherein the reference voltage ($U_{ref}$) is provided between a Zener diode (13.1), which is electrically connected to the supply voltage source for the power semiconductor switch (20), and a parallel circuit comprising a first resistor (13.2) and a first capacitor (13.3), which is electrically connected to ground (GND).

3. The method as claimed in claim 1, wherein the voltage drop ($U_A$) across the load path of the power semiconductor switch (20) is tapped off at an anode of at least one decoupling diode (11), which is electrically connected to a drain terminal or a collector terminal of the power semiconductor switch (20), wherein the at least one decoupling diode (11) is fed an auxiliary current from a current source (12) by means of a pull-up resistor (19).

4. The method as claimed in claim 3, further comprising the following step:
   preventing (5) charging of an input filter, which is connected electrically in parallel with the power semiconductor switch (20), by means of the pull-up resistor (19) in a switched-off state by means of a clamping transistor (16).

5. A device (10) for short-circuit detection by saturation detection in power semiconductor switches, comprising:
   at least one decoupling diode (11), which is designed to be electrically connected to a drain terminal (21) or a collector terminal of a power semiconductor switch (20), wherein a voltage drop ($U_A$) across an anode of the at least one decoupling diode (11) corresponds to a voltage drop ($U_A$) across a load path of the power semiconductor switch (20);
   a current source (12), which is electrically connected to the at least one decoupling diode (11) and is designed to feed an auxiliary current into a load path of the power semiconductor switch (20) when the at least one decoupling diode (11) is electrically connected to the drain terminal or the collector terminal of the power semiconductor switch (20);

a reference voltage source (13), which is designed to be electrically connected to a supply current source for the power semiconductor switch (20) and to provide a reference voltage ($U_{ref}$) depending on a supply voltage ($U_{VDD}$) of the supply current source, with the result that the reference voltage ($U_{ref}$) follows changes in the supply voltage ($U_{VDD}$);

a comparator circuit (14), which is electrically connected to the at least one decoupling diode (11) and the reference voltage source (13) and is designed to generate a differential voltage ($U_{diff}$), which corresponds to a difference between the voltage drop ($U_A$) across the load path of the power semiconductor switch (20) and the provided reference voltage ($U_{ref}$); and evaluation electronics (15), which are designed to compare the generated differential voltage ($U_{diff}$) with a predetermined limit voltage ($U_{lim}$), wherein a short-circuit current is detected in the load path of the power semiconductor switch (20) when the differential voltage ($U_{diff}$) exceeds the limit voltage ($U_{lim}$), and to open the power semiconductor switch (20) when a short-circuit current has been detected in the load path of the power semiconductor switch (20).

6. The device (10) as claimed in claim 5, wherein the reference voltage source (13) comprises a Zener diode (13.1) and a parallel circuit comprising a first resistor (13.2) and a first capacitor (13.3), wherein the reference voltage ($U_{ref}$) is provided between the Zener diode (13.1), which is electrically connected to the supply current source for the power semiconductor switch (20), and the parallel circuit, which is electrically connected to ground (GND).

7. The device (10) as claimed in claim 5, wherein the at least one decoupling diode (11) is fed the auxiliary current by means of a pull-up resistor (19).

8. The device (10) as claimed in claim 5, further comprising an input filter, which is connected electrically in parallel with the power semiconductor switch (20).

9. The device (10) as claimed in claim 8, further comprising a clamping transistor (16), which and is designed to prevent charging of the input filter by means of the pull-up resistor (19) in a switched-off state.

* * * * *